(12) United States Patent
Tanomura (10) Patent No.: US 11,848,647 B2
(45) Date of Patent: Dec. 19, 2023

(54) DOHERTY AMPLIFIER

(71) Applicant: SUMITOMO ELECTRIC INDUSTRIES, LTD., Osaka (JP)

(72) Inventor: Masahiro Tanomura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 388 days.

(21) Appl. No.: 17/302,661

(22) Filed: May 10, 2021

(65) Prior Publication Data

US 2021/0367558 A1 Nov. 25, 2021

(30) Foreign Application Priority Data

May 21, 2020 (JP) .................. 2020-088919

(51) Int. Cl.
| | |
|---|---|
| *H03F 1/02* | (2006.01) |
| *H03F 3/21* | (2006.01) |
| *H01P 5/18* | (2006.01) |
| *H03F 1/56* | (2006.01) |

(52) U.S. Cl.
CPC .......... *H03F 1/0288* (2013.01); *H01P 5/18* (2013.01); *H03F 3/211* (2013.01); *H03F 1/56* (2013.01); *H03F 2200/222* (2013.01); *H03F 2200/387* (2013.01); *H03F 2200/451* (2013.01)

(58) Field of Classification Search
CPC .......... H03F 1/0288; H03F 3/211; H03F 1/56; H03F 2200/222; H03F 2200/387; H03F 2200/451; H01P 5/18
USPC .............................................. 330/124 R, 284
See application file for complete search history.

(56) References Cited

U.S. PATENT DOCUMENTS

| | | | |
|---|---|---|---|
| 4,837,530 A | 6/1989 | Kondoh | |
| 7,518,449 B2 | 4/2009 | Iwasaki | |
| 9,225,291 B2* | 12/2015 | Ahmed | ...................... H03F 3/68 |
| 9,647,611 B1* | 5/2017 | Embar | .................. H03F 1/0288 |
| 9,948,245 B2* | 4/2018 | Kerek | .................... H03F 1/3282 |
| 10,103,690 B2* | 10/2018 | Yanduru | .................. H03F 3/195 |
| 10,530,313 B2* | 1/2020 | Lee | ......................... H03F 1/0288 |
| 2004/0232989 A1 | 11/2004 | Eo et al. | |
| 2008/0032653 A1 | 2/2008 | Inoue | |
| 2015/0116039 A1* | 4/2015 | Ahmed | .................. H03F 1/0233 |
| | | | 330/295 |
| 2016/0285420 A1* | 9/2016 | Jones | ....................... H01L 23/66 |

(Continued)

FOREIGN PATENT DOCUMENTS

| | | |
|---|---|---|
| JP | H02-002702 | 1/1990 |
| JP | 2004-350276 | 12/2004 |

(Continued)

*Primary Examiner* — Hafizur Rahman
(74) *Attorney, Agent, or Firm* — IPUSA, PLLC (57) ABSTRACT

A Doherty amplifier includes a divider configured to divide input power into first input power and second input power, and a carrier amplifier configured to amplify the first input power. The Doherty amplifier includes an adaptive attenuator configured to attenuate the second input power, the adaptive attenuator being configured to increase an attenuation amount upon detecting that the second input power is less than a predetermined value. The Doherty amplifier includes a peaking amplifier configured to amplify the attenuated second input power, and a combiner configured to combine output power of the carrier amplifier with output power of the peaking amplifier.

5 Claims, 4 Drawing Sheets

(56) References Cited

U.S. PATENT DOCUMENTS

| | | | | |
|---|---|---|---|---|
| 2017/0111014 A1* | 4/2017 | Staudinger | ............ | H03F 1/0288 |
| 2017/0126181 A1* | 5/2017 | Embar | .................... | H03F 3/245 |
| 2018/0006611 A1* | 1/2018 | de Jong | .................. | H03F 3/213 |
| 2018/0026583 A1* | 1/2018 | Yanduru | .................. | H03F 3/195 |
| | | | | 330/289 |

FOREIGN PATENT DOCUMENTS

| | | |
|---|---|---|
| JP | 2006-311485 | 11/2006 |
| JP | 2008-078847 | 4/2008 |
| WO | 2006/100726 | 9/2006 |

\* cited by examiner

DOHERTY AMPLIFIER

CROSS-REFERENCE TO RELATED APPLICATION

This application claims priority under 35 U.S.C. § 119 to Japanese Patent Application No. 2020-088919, filed May 21, 2020, the contents of which are incorporated herein by reference in their entirety.

BACKGROUND

1. Field of the Invention

The present disclosure relates to a Doherty amplifier.

2. Description of the Related Art

Doherty amplifiers are composite amplifiers with carrier amplifiers and peaking amplifiers, and achieve greater efficiency at a backoff time. For this reason, Doherty amplifiers are used in communication systems or other systems of which power consumption is increased. Base stations are examples of the communication systems. For purposes of increasing the efficiency at a backoff time, for example, the size of a transistor used in a carrier amplifier is set to be smaller than the size of a transistor used in a peaking amplifier.

However, when the transistor of the carrier amplifier is reduced in size, saturated output power is decreased. In this regard, for a technique to avoid the decrease in the saturated output power, an active bias technique for a gate is disclosed. In such an active bias technique, power entering a Doherty amplifier is detected, and a voltage corresponding to the detected power is generated using an operational amplifier. Then, the voltage generated by the operational amplifier is applied to a gate of a transistor included in a peaking amplifier. The transistor is used to amplify radio frequency (RF) power from the peaking amplifier (see, for example, Unexamined Japanese Patent Application No. 2008-078847, which is hereafter referred to as Patent document 1).

SUMMARY

According to one aspect of one or more embodiments, a Doherty amplifier includes a divider configured to divide input power into first input power and second input power, and a carrier amplifier configured to amplify the first input power. The Doherty amplifier includes an adaptive attenuator configured to attenuate the second input power, the adaptive attenuator being configured to increase an attenuation amount upon detecting that the second input power is less than a predetermined value. The Doherty amplifier includes a peaking amplifier configured to amplify the attenuated second input power, and a combiner configured to combine output power of the carrier amplifier with output power of the peaking amplifier.

DESCRIPTION OF THE EMBODIMENTS

For the related art described in Patent document 1, the inventor of this application has recognized the following issue. When a Doherty amplifier with an operational amplifier is fabricated using, for example, a III-V semiconductor substrate, a circuit area may be increased in comparison to a case of using a silicon semiconductor substrate. For example, a circuit size (area) of the operational amplifier that is fabricated using a III-V semiconductor substrate is about 9 times a circuit size (area) of an operational amplifier that is fabricated using a silicon semiconductor substrate. The increased circuit area in an integrated circuit results in increased manufacturing costs.

In light of the issue described above, the present disclosure has an object to provide a Doherty amplifier that can avoid a decrease in saturated output power while minimizing an increased circuit size.

DESCRIPTION OF EMBODIMENTS OF THE PRESENT DISCLOSURE

One or more embodiments of the present disclosure will be outlined.

[1] A Doherty amplifier according to one aspect of the present disclosure includes a divider configured to divide input power into first input power and second input power, and a carrier amplifier configured to amplify the first input power. The Doherty amplifier includes an adaptive attenuator configured to attenuate the second input power, the adaptive attenuator being configured to increase an attenuation amount upon detecting that the second input power is less than a predetermined value. The Doherty amplifier includes a peaking amplifier configured to amplify the attenuated second input power, and a combiner configured to combine output power of the carrier amplifier with output power of the peaking amplifier.

In the Doherty amplifier according to the one aspect of the present disclosure, the adaptive attenuator increases an attenuation amount of power entering the peaking amplifier when second input power corresponding to input power entering the Doherty amplifier is low. With such a configuration, input power entering the peaking amplifier can be reduced when the input power is low, and only the carrier amplifier can operate at a backoff time. Accordingly, efficiency at the backoff time can be increased. Further, input power entering the peaking amplifier can be reduced without using an operational amplifier having an increased circuit size. Thus, efficiency can be improved even when a backoff amount is increased. As a result, a Doherty amplifier that can avoid a decrease in saturated output power while minimizing an increased circuit size can be provided.

[2] For [1] above, the adaptive attenuator may include a directional coupler configured to remove first power that is a portion of the second input power, a voltage generator circuit including a first transistor, the first transistor including a gate to which the first power removed by the directional coupler is applied, and the voltage generator circuit being configured to generate a first DC voltage increasing in accordance with a decrease in the first power. The adaptive attenuator may include a level shifter circuit including a second transistor, the second transistor including a gate to which the first DC voltage is applied, and the level shifter circuit being configured to generate a second DC voltage corresponding to the first DC voltage. The adaptive attenuator may include a voltage variable attenuator configured to output the second input power corresponding to a magnitude of the second DC voltage, to the peaking amplifier, the voltage variable attenuator being configured to increase an attenuation amount of the second input power to be output, upon detecting that the second DC voltage is equal to or exceeds a second predetermined value.

The directional coupler removes first power that is a portion of second input power divided, by the divider, from input power entering the Doherty amplifier, and applies the removed input power to a gate of a first transistor. With such a configuration, each of a first DC voltage generated by the first transistor and a second DC voltage generated based on the first DC voltage can correspond to input power entering the Doherty amplifier. Thus, an attenuation amount of power provided by the voltage variable attenuator can be adjusted depending on input power entering the Doherty amplifier.

[3] For [2] above, the voltage generator circuit includes an input terminal to which the first power is applied, a first voltage line, a reference voltage line, and a first capacitive element with a first end electrically connected to the input terminal and a second end electrically connected to the gate of the first transistor, the first transistor including a drain. The voltage generator circuit includes a first resistive element and a second resistive element electrically connected in series between the first voltage line and the reference voltage line, a node between the first resistive element and the second resistive element being electrically connected to the gate of the first transistor. The voltage generator circuit includes a third resistive element electrically connected between the first voltage line and the drain of the first transistor, and a second capacitive element electrically connected between the drain of the first transistor and the reference voltage line. The drain of the first transistor may be electrically connected to the gate of the second transistor included in the level shifter circuit. With such a configuration, the voltage generator circuit can generate a first DC voltage that drops when input power is increased and that increases when input power is decreased. Thus, an attenuation amount of power provided by the voltage variable attenuator can be adjusted based on a generated first DC voltage.

[4] For [3] above, the second transistor includes a source and a drain electrically connected to the first voltage line. The level shifter circuit includes a fourth resistive element electrically connected between the source of the second transistor and the reference voltage line. The level shifter circuit may be configured to output the second DC voltage via the source of the second transistor. With such a configuration, the level shifter circuit can shift first DC voltage generated by the voltage generator circuit, to a second DC voltage in a range suitable for adjusting an attenuation amount provided by the voltage variable attenuator.

[5] For [3] or [4] above, the voltage generator circuit may include a fifth resistive element electrically connected between the drain of the first transistor and the gate of the second transistor. With the fifth resistive element, RF power leakage from the first transistor to the level shifter circuit can be prevented.

[6] For any one of [3] to [5] above, the voltage variable attenuator may include an input terminal to which the second power output from the directional coupler is applied, and an output terminal for providing the attenuated second input power. The voltage variable attenuator may include a third capacitive element electrically connected in series between the input terminal and the output terminal, and a plurality of transmission lines, and a fourth capacitive element. The voltage variable attenuator may include a third transistor with a drain electrically connected between given two transmission lines among the plurality of transmission lines, a gate to which the second DC voltage is applied, and a source electrically connected to the reference voltage line. By applying a second DC voltage to a gate of a third transistor, which has a drain to which a given transmission line is connected, the voltage variable attenuator can provide an increased attenuation amount when input power is low, as well as providing a decreased attenuation amount when input power is high.

[7] For any one of [1] to [6] above, each of the carrier amplifier and the peaking amplifier may be configured to operate in class B or class AB. By the carrier amplifier operating in class B or class AB, a decrease in saturated output power can be avoided.

[8] For any one of [1] to [7] above, the Doherty amplifier may further include a III-V semiconductor substrate on which the carrier amplifier, the adaptive attenuator, and the peaking amplifier are mounted. The Doherty amplifier according to one or more embodiments does not include an operational amplifier. Thus, even when the Doherty amplifier is fabricated with a III-V semiconductor substrate, the Doherty amplifier can have a similar circuit size to that set in a case of fabricating a Doherty amplifier with a silicon semiconductor.

Details of Embodiments of the Present Disclosure

Specific examples of a Doherty amplifier of the present disclosure will be described below with reference to the drawings. In the following description, the same numbers are used to denote the same or corresponding elements, and description for those elements may be omitted. A given number among the numbers expressing an input terminal, an output terminal, and nodes may also be used to refer to a signal, voltage, current, or power. Also, a given number among the numbers expressing power supply terminals (including a ground terminal) may also be used to refer to a power supply voltage or a power supply line.

First Embodiment

Block Diagram of Circuit Configuration of Doherty Amplifier

Figure 1:
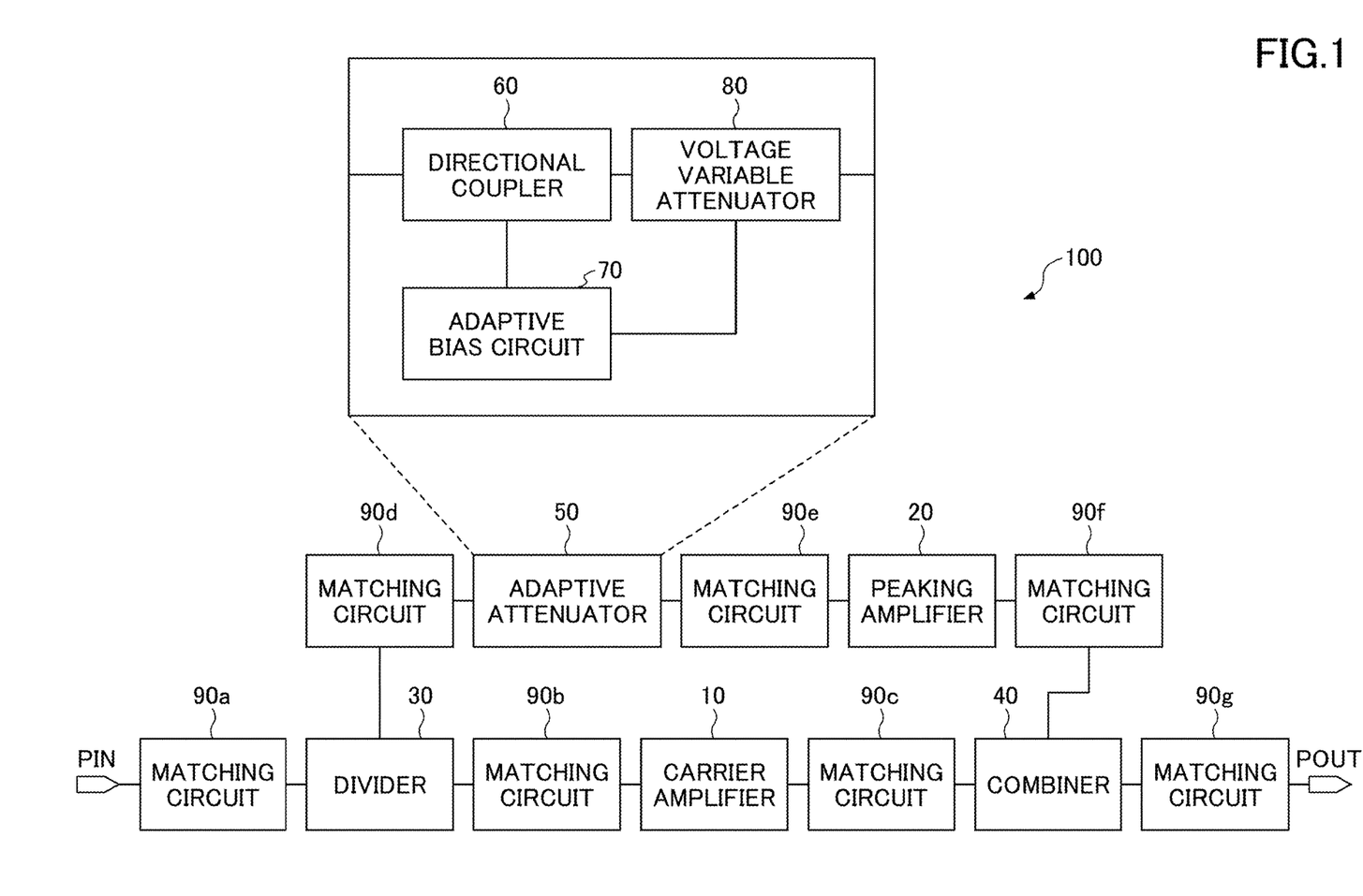
FIG. 1 is a block diagram illustrating an example of a circuit configuration of a Doherty amplifier according to a first embodiment.

FIG. 1 is a block diagram illustrating an example of the circuit configuration of the Doherty amplifier according to a first embodiment. For example, a Doherty amplifier 100 illustrated in FIG. 1 includes a carrier amplifier 10, a peaking amplifier 20, a divider 30, a combiner 40, an adaptive attenuator 50, and multiple matching circuits 90 (90a, 90b, 90c, 90d, 90e, 90f, and 90g). For example, the Doherty amplifier 100 is formed using a compound semiconductor substrate such as a III-V semiconductor substrate.

An input terminal PIN of the Doherty amplifier 100 is connected to an input of the divider 30 via a matching circuit 90a. One of two outputs of the divider 30 is connected to an input of the carrier amplifier 10 via a matching circuit 90b. An output of the carrier amplifier 10 is connected to one of two inputs of the combiner 40 via a matching circuit 90c.

Another output of the divider 30 is connected to an input of the adaptive attenuator 50 via a matching circuit 90d. An output of the adaptive attenuator 50 is connected to an input of the peaking amplifier 20 via a matching circuit 90e. An output of the peaking amplifier 20 is connected to another input of the combiner 40 via a matching circuit 90f. An output of the combiner 40 is connected to an output terminal POUT of the Doherty amplifier 100.

The divider 30 receives an input signal PIN applied to the input terminal PIN, via the matching circuit 90a. The divider 30 also divides the received input signal PIN into two signals, and outputs the respective signals to the carrier amplifier 10 and the adaptive attenuator 50. In other words, the divider 30 divides input power entering the input terminal PIN into first input power and second input power. Then, the divider 30 outputs the first input power to the matching circuit 90b, and outputs the second input power to the matching circuit 90d.

For example, the carrier amplifier 10 operates in class B or class AB. The carrier amplifier 10 amplifies power of the input signal that is received, via the matching circuit 90b, from the divider 30, and outputs the signal having the amplified power to the combiner 40 via the matching circuit 90c.

The adaptive attenuator 50 includes a directional coupler 60, an adaptive bias circuit 70, and a voltage variable attenuator 80. An example of the circuit of each of the directional coupler 60, the adaptive bias circuit 70, and the voltage variable attenuator 80 will be described with reference to FIG. 2. The adaptive attenuator 50 attenuates power of the divided signal that is output, via the matching circuit 90d, from the divider 30, and outputs the signal having the attenuated power to the peaking amplifier 20 via the matching circuit 90e. The adaptive attenuator 50 increases an attenuation amount at a low power input, based on power of a given input signal. The adaptive attenuator 50 also decreases an attenuation amount at a high power input, based on power of a given input signal. The adaptive attenuator 50 may set the attenuation amount to zero, at the high power input.

For example, the peaking amplifier 20 operates in class B or class AB. The peaking amplifier 20 amplifies the power of the input signal that is received, via the matching circuit 90e, from the adaptive attenuator 50, and outputs the signal having the amplified power to the combiner 40 via the matching circuit 90f. The combiner 40 combines respective signals received from the carrier amplifier 10 and the peaking amplifier 20, into a combined signal. The combiner 40 also causes the combined signal as an output signal POUT to be output from the output terminal POUT, via the matching circuit 90g.

Circuit Configuration of Adaptive Attenuator

Figure 2:
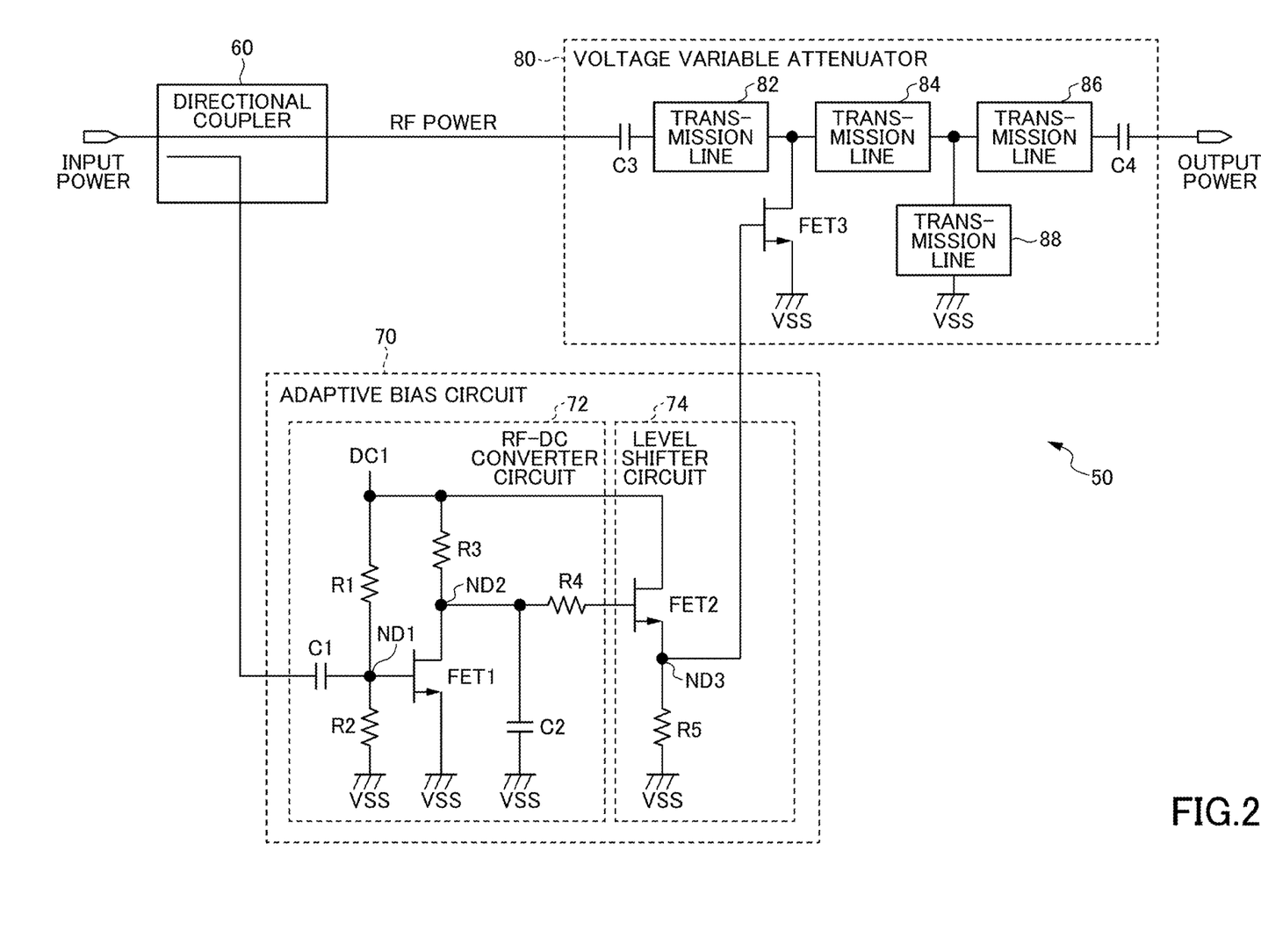
FIG. 2 is a circuit diagram illustrating an example of the configuration of an adaptive attenuator illustrated in FIG. 1.

FIG. 2 is a circuit diagram illustrating an example of the adaptive attenuator 50 illustrated in FIG. 1. The adaptive attenuator 50 includes the directional coupler 60, the adaptive bias circuit 70, and the voltage variable attenuator 80, as illustrated in FIG. 1.

The directional coupler 60 is a coupler such as a coupler comprised of two transmission lines that are coupled closely. One of these transmission lines is connected to an input of the voltage variable attenuator 80, and another transmission line is connected to an input of the adaptive bias circuit 70. The directional coupler 60 removes a portion of power of the signal from the matching circuit 90d. Further, the directional coupler 60 outputs, as first power, the removed portion of the power to the adaptive bias circuit 70, and outputs second power, which is a portion of the input power output from the divider 30 (FIG. 1), excluding the first power, to the voltage variable attenuator 80. For example, a coupling factor of the directional coupler 60 is between 6 dB and 20 dB, and preferably 10 dB.

The adaptive bias circuit 70 includes an RF-DC (direct current) converter circuit 72 and a level shifter circuit 74. The RF-DC converter circuit 72 includes capacitors C1 and C2, resistors R1, R2, R3, and R4, and a field effect transistor (FET1). The level shifter circuit 74 includes a field effect transistor FET2 and a resistor R5. The RF-DC converter circuit 72 is an example of a voltage generator circuit that generates a first DC voltage increasing in accordance with a decrease in first power. The level shifter circuit 74 generates a second DC voltage corresponding to the first DC voltage.

The transistor FET1 is an example of a first transistor, and the transistor FET2 is an example of a second transistor. The resistors R1, R2, and R3 are respectively examples of a first resistive element, a second resistive element, and a third resistive element. The resistor R4 is an example of a fifth resistive element, and the resistor R5 is an example of a fourth resistive element. The capacitor C1 is an example of a first capacitive element, and the capacitor C2 is an example of a second capacitive element. For example, the resistors R1, R2, R3, R4, and R5 are each formed using a metal interconnect or an epitaxial layer. For example, the capacitors C1 and C2 are metal-insulator-metal (MIM) capacitors.

In the RF-DC converter circuit 72, one end of the capacitor C1 is connected to the directional coupler 60 via an input terminal not illustrated of the adaptive bias circuit 70, and another end of the capacitor C1 is connected to a gate of the transistor FET1 via a connection node ND1. For example, capacitance of the capacitor C1 is set to, for example, between 0.05 pF and 0.4 pF, and preferably between 0.12 pF and 0.22 pF. By connecting the capacitor C1 to the input terminal of the adaptive bias circuit 70, DC component transfer from the RF-DC converter circuit 72 to the directional coupler 60 can be interrupted, and only an RF signal can be transmitted to the RF-DC converter circuit 72.

The resistors R1 and R2 are connected in series between a DC voltage line DC1 and a ground line VSS, and the connection node ND1 is between the resistors R1 and R2. The DC voltage line DC1 is an example of a first voltage line, and the ground line VSS is an example of a reference voltage line. For example, a voltage associated with the DC voltage line DC1 is set between 1.6 V and 2.4 V. The resistors R1 and R2 serve to divide a voltage fed to the DC voltage line DC1. In such a case, a resistance of each of the resistors R1 and R2 is preferably increased from the viewpoint of reducing a current flowing through the resistors. However, the resistance of each of the resistors R1 and R2 is preferably decreased from the viewpoint of reducing a chip size. Although not particularly restricted, for example, a resistance of each of the resistors R1 and R2 is set between 100 Ω and 1000Ω, and preferably between 400 Ω and 500Ω.

The gate of the transistor FET 1 is connected to an output of the directional coupler 60, via the connection node ND1 and the capacitor C1. A drain of the transistor FET1 is connected to the DC voltage line DC1 via a connection node ND2 and the resistor R3. A source of the transistor FET1 is connected to the ground line VSS. A resistance of the resistor R3 is set between 100Ω and 1000Ω, and preferably between 400Ω and 500Ω.

One end of the capacitor C2 is connected to the connection node ND2 (e.g., drain of the transistor FET1), and another end is connected to the ground line VSS. The capacitor C2 is used for rectifying a voltage output from the transistor FET1. For example, capacitance of the capacitor C2 is set between 0.1 pF and 2 pF, and preferably between 0.12 pF and 0.22 pF. One end of the resistor R4 is connected to the drain (connection node ND2) of the transistor FET1, and another end is connected to a gate of the transistor FET2 via an output terminal not illustrated of the RF-DC converter circuit 72.

With the resistor R4, RF power leakage from the transistor FET1 to the transistor FET2 can be prevented. In such a manner, a resistance of the resistor R4 is preferably increased. However, the resistance is preferably decreased from the viewpoint of minimizing an increased circuit size of the Doherty amplifier 100. Although not particularly restricted, in this example, a resistance of the resistor R4 is set between 50Ω and 200Ω, and preferably between 80Ω and 120Ω.

In the level shifter circuit 74, the transistor FET2 and the resistor R5 are connected in series between the DC voltage line DC1 and the ground line VSS. A connection node ND3 at which a source of the transistor FET2 and the resistor R5 are connected is connected to a gate of the transistor FET3 of the voltage variable attenuator 80. Although not particularly restricted, a resistance of the resistor R5 is set, for example, between 100Ω and 1000Ω, and preferably between 300Ω and 400Ω.

The voltage variable attenuator 80 includes a capacitor C3 connected in series between an input terminal and output terminal for an RF signal. The voltage variable attenuator 80 also includes transmission lines 82, 84 and 86, a capacitor C4, a field effect transistor FET 3, and a transmission line 88. Each of the capacitors C3 and C4 has a function of interrupting the DC component transfer. Capacitance of each of the capacitors C3 and C4 is set, for example, between 0.1 pF and 2 pF, and preferably between 0.8 pF and 1.2 pF. The transmission lines 82, 84, and 86 achieve matching with respect to a given RF input and a given RF output. For example, the capacitors C3 and C4 are MIM capacitors. The capacitors C3 and C4 are respectively examples of a third capacitive element and a fourth capacitive element. The transistor FET3 is an example of a third transistor.

In terms of a DC signal, when an output voltage of the level shifter circuit 74 exceeds a threshold voltage of the transistor FET 3, the transistor FET 3 has a function of short-circuiting the drain of the transistor FET 3 and the ground line VSS. The transmission line 88 becomes open with respect to the transmission lines 84 and 86, in terms of an RF signal. Note that the transmission line 88 may be comprised of an element such as a spiral inductor of which a line length is equivalent to λ/4. When the transmission line 88 is comprised of a spiral inductor, the layout of the transmission line 86 can be reduced in size.

For example, the transistors FET1, FET2, and FET3, as well as transistors provided in the carrier amplifier 10 and the peaking amplifier 20 illustrated in FIG. 1, are enhancement field effect transistors each formed using a compound semiconductor substrate such as a III-V semiconductor substrate. When transistors such as the transistors FET1, FET2, and FET3 are the same type and kind, e.g., an enhancement field effect transistor formed using a given compound semiconductor substrate, a common process of manufacturing a semiconductor is performed to enable the Doherty amplifier 100 to be formed on one semiconductor substrate. Accordingly, a smaller chip size of the Doherty amplifier 100 can be set in comparison to a case of using different types of transistors. Note that the transistors such as the transistors FET1, FET2, and FET3 may be depletion transistors.

Operation of Adaptive Bias Circuit

Figure 3:
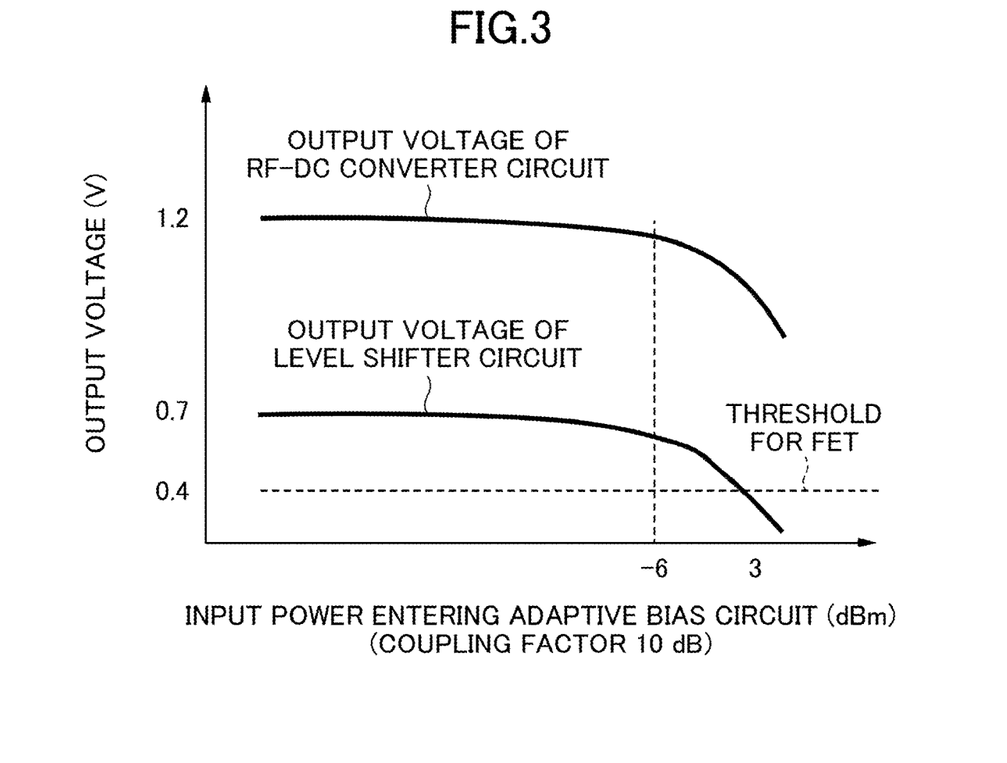
FIG. 3 is a diagram for describing an example of the operation of an adaptive bias circuit illustrated in FIG. 2.

FIG. 3 is a diagram for describing an example of the operation of the adaptive bias circuit 70 illustrated in FIG. 2. In FIG. 3, the horizontal axis represents the input power (dBm) entering the adaptive bias circuit 70, where a coupling factor of the directional coupler 60 illustrated in FIG. 2 is 10 dB. The vertical axis in FIG. 3 represents the output voltage (V) associated with the adaptive bias circuit 70.

When the directional coupler 60 outputs RF power to the RF-DC converter circuit 72 illustrated in FIG. 2, a drain current of the transistor FET1 increases due to rectification provided by the transistor FET1, the resistor R3, and the capacitor C2. Due to the increased drain current, a voltage drop across the resistor R3 occurs and thus a drain voltage of the transistor FET1 decreases. For this reason, the output voltage of the RF-DC converter circuit 72 decreases as input power entering the adaptive bias circuit 70 increases. In this case, the output voltage drop occurs significantly as the input power increases. The drain voltage of the transistor FET1 (voltage associated with the connection node ND2) is an example of a first DC voltage.

In accordance with the decreased output voltage of the RF-DC converter circuit 72, the gate voltage of the transistor FET2 of the level shifter circuit 74 decreases, and thus the drain current of the transistor FET2 decreases. Due to the decreased drain current of the transistor FET 2, a voltage drop across the resistor R5 occurs and thus a voltage applied to the variable attenuator 80 decreases.

In such a manner, the second DC voltage, which is an output voltage of the level shifter circuit 74, decreases in accordance with increased input power that enters the adaptive bias circuit 70. In this case, the second DC voltage drop occurs significantly as the input power increases. In other words, the DC voltage to be applied to the gate of the transistor FET3 of the voltage variable attenuator 80 decreases in accordance with the increased input power that enters the adaptive bias circuit 70. In this case, the DC voltage drop occurs significantly as the input power increases.

As described above, in the adaptive bias circuit 70, the RF-DC converter circuit 72 can generate the DC voltage decreasing when input power from the directional coupler 60 increases. The RF-DC converter circuit 72 can also generate the DC voltage increasing when the input power decreases. Further, in the adaptive bias circuit 70, the level shifter circuit 74 shifts the DC voltage output from the RF-DC converter circuit 72, to a bias in a range suitable for adjusting an attenuation amount of power provided by the voltage variable attenuator 80. Then, the level shifter circuit 74 can apply the bias to the voltage variable attenuator 80. That is, the voltage variable attenuator 80 can adjust an attenuation amount of power, based on the DC voltage generated by the RF-DC converter circuit 72.

In one embodiment, the input power entering the adaptive bias circuit 70 is power obtained by division of input power entering the Doherty amplifier 100, where the division is performed through the divider 30 and the directional coupler 60. The input power entering the adaptive bias circuit 70 varies in accordance with the input power entering the Doherty amplifier 100. Thus, an attenuation amount of power provided by the voltage variable attenuator 80 can be adjusted depending on the input power entering the Doherty amplifier 100.

Operation of Adaptive Attenuator

Figure 4:
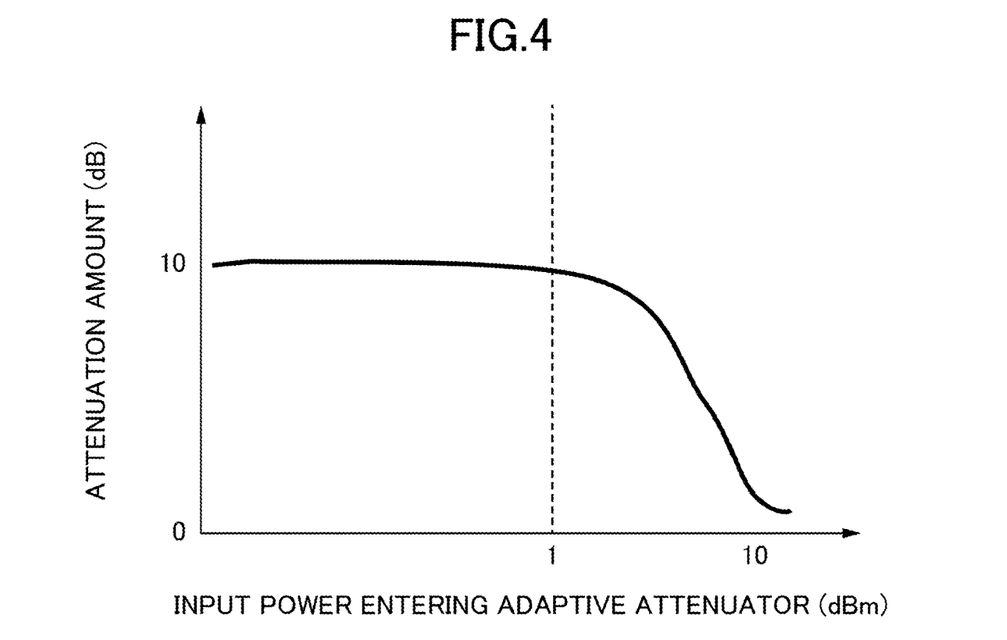
FIG. 4 is a diagram for describing an example of the operation of the adaptive attenuator illustrated in FIG. 2.

FIG. 4 is a diagram for describing an example of the operation of the adaptive attenuator 50 illustrated in FIG. 2. In FIG. 4, the horizontal axis represents the input power (dBm) entering the adaptive attenuator 50. The vertical axis represents the attenuation amount (dBm) of the output power of the adaptive attenuator 50.

In FIG. 4, it is assumed that when the input power PIN is low, a DC bias applied from the adaptive bias circuit 70 to the voltage variable attenuator 80 is equal to or exceeds a threshold voltage (for example, 0.4 V) of the transistor FET 3. In this case, the adaptive attenuator 50 provides an increased attenuation amount because the transistor FET 3 serves as a shunt resistor of which an on resistance is a few ohms or less, from the viewpoint of the transmission lines 82 and 84.

Further, it is assumed that when the input power PIN is high, a DC bias applied from the adaptive bias circuit 70 to the voltage variable attenuator 80 is less than the threshold voltage of the transistor FET 3. In this case, the adaptive attenuator 50 provides a decreased attenuation amount because the transistor FET 3 serves as an off resistance and off capacitance (i.e., in an open state), from the viewpoint of the transmission lines 82 and 84.

In light of the operation described above, by setting a DC bias applied to the voltage variable attenuator 80 to be variable with respect to the threshold voltage of the transistor FET 3, an attenuation amount provided by the adaptive attenuator 50 can vary in accordance with the DC bias. The DC bias to be applied to the voltage variable attenuator 80 varies in accordance with the input voltage applied by the directional coupler 60. In other words, the DC bias to be applied to the voltage variable attenuator 80 can vary in accordance with the input voltage applied to the Doherty amplifier 100. As a result, the adaptive attenuator 50 can provide an increased attenuation amount or a decreased attenuation amount, based on the input power PIN.

Operation of Doherty Amplifier

Figure 5:
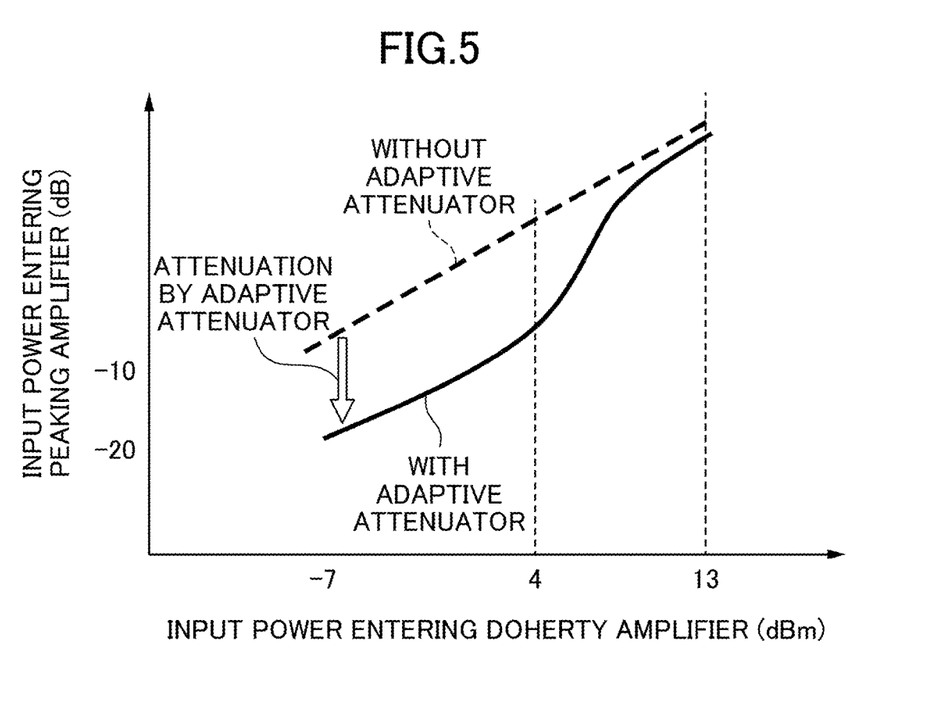
FIG. 5 is a diagram for describing an example of the operation of the Doherty amplifier with the adaptive attenuator illustrated in FIG. 1 and the operation of the Doherty amplifier from which the adaptive attenuator is removed.

FIG. 5 is a diagram for describing an example of the operation of the Doherty amplifier 100 with the adaptive attenuator 50 illustrated in FIG. 1 and the operation of the Doherty amplifier 100 from which the adaptive attenuator 50 is removed. In FIG. 5, the horizontal axis represents the input power (dBm) entering the Doherty amplifier 100, and the vertical axis represents the input power (dBm) entering the peaking amplifier 20.

As described in FIGS. 3 and 4, when input power entering the adaptive attenuator 50 is low and the gate voltage of the transistor FET 3 of the voltage variable attenuator 80 is equal to or exceeds the threshold voltage of the transistor FET 3, an attenuation amount of power provided by the adaptive attenuator 50 increases. In contrast, when input power entering the adaptive attenuator 50 is high and the gate voltage of the transistor FET 3 of the variable attenuator 80 is less than the threshold voltage of the transistor FET 3, an attenuation amount of power provided by the adaptive attenuator 50 decreases.

The input voltage to be applied to the adaptive attenuator 50 is supplied from the input terminal PIN of the Doherty amplifier 100, via the divider 30 and the directional coupler 60. In this case, the input voltage to be applied to the adaptive attenuator 50 is proportional to the input power PIN entering the Doherty amplifier 100. Thus, when the input power PIN entering the Doherty amplifier 100 is less than a predetermined value, the input power attenuated by the adaptive attenuator 50 can enter the peaking amplifier 20. Also, when the input power PIN entering the Doherty amplifier 100 is equal to or exceeds the predetermined value, the input power entering the peaking amplifier 20 can be equivalent to power entering the peaking amplifier 20 in a case of the Doherty amplifier 100 from which the adaptive attenuator 50 is removed.

Figure 6:
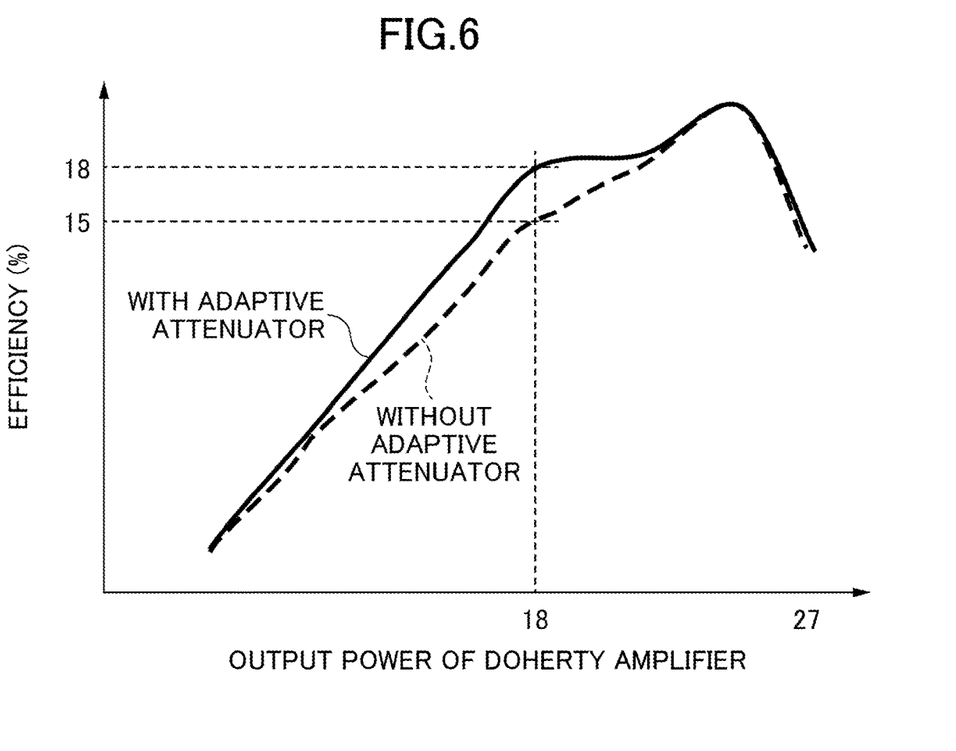
FIG. 6 is a diagram for describing an example of properties of the Doherty amplifier with the adaptive attenuator illustrated in FIG. 1 and properties of the Doherty amplifier from which the adaptive attenuator is removed.

FIG. 6 is a diagram for describing an example of properties of the Doherty amplifier 100 with the adaptive attenuator 50 illustrated in FIG. 1 and properties of the Doherty amplifier 100 from which the adaptive attenuator 50 is removed.

In the present embodiment, the adaptive attenuator 50 can cause only the carrier amplifier 10 to operate at a backoff time, thereby enabling the efficiency to be increased at the backoff time. Further, the carrier amplifier 10 operates in class B or class AB, where a higher gate voltage of the carrier amplifier 10 can be set. Accordingly, a decrease in saturation output power can be avoided.

As described above, in the Doherty amplifier 100 illustrated in FIG. 1, even when the carrier amplifier 10 operates in class B or class AB, the adaptive attenuator 50 increases an attenuation amount at a low power input, thereby enabling the input power entering the peaking amplifier 20 to be reduced. Further, the adaptive attenuator 50 decreases an attenuation amount at a high power input, thereby enabling the input power entering the peaking amplifier 20 to be increased. Moreover, by adjusting the input power reduced by a decreased attenuation amount, to input power at a desired backoff time, the input power entering the peaking amplifier 20 can be reduced. Accordingly, efficiency can be improved even when a backoff amount is increased.

Further, the adaptive attenuator 50 illustrated in FIG. 2 is comprised of three transistors FET1, FET2, and FET3, without including an operational amplifier. Such an adaptive attenuator 50 does not include a large capacitor of which capacitance is tens of picofarads or more. Thus, even when the Doherty amplifier 100 is fabricated using a III-V semiconductor substrate, the Doherty amplifier 100 can have the small size of about 200 μm×about 300 μm, for example.

Such a size is about 10% of a size (area) required to fabricate a Doherty amplifier with an operational amplifier, by using a III-V semiconductor substrate. In other words, even when the Doherty amplifier 100 is fabricated using a III-V semiconductor substrate, the Doherty amplifier 100 can have a similar circuit size to that in a case where a given Doherty amplifier with an operational amplifier is fabricated using a silicon semiconductor, because the Doherty amplifier 100 does not include an operational amplifier.

The embodiments and the like of the present disclosure have been described. However, the present disclosure is not limited to the above-mentioned embodiments and the like. Various modifications, changes, substitutions, additions, deletions, or any combination of embodiments can be made within the scope set forth in the claims. These fall within a technical scope of the present disclosure.

What is claimed is:

1. A Doherty amplifier comprising:
a divider configured to divide input power into first input power and second input power;
a carrier amplifier configured to amplify the first input power;
an adaptive attenuator configured to attenuate the second input power, the adaptive attenuator being configured to increase an attenuation amount upon detecting that the second input power is less than a predetermined value;
a peaking amplifier configured to amplify the attenuated second input power, the attenuated second input power being output from the adaptive attenuator; and
a combiner configured to combine output power of the carrier amplifier with output power of the peaking amplifier,
wherein the adaptive attenuator includes:
a directional coupler configured to remove first power that is a portion of the second input power;
a voltage generator circuit including a first transistor, the first transistor including a gate to which the first power removed by the directional coupler is applied, and the voltage generator circuit being configured to generate a first DC voltage increasing in accordance with a decrease in the first power;
a level shifter circuit including a second transistor, the second transistor including a gate to which the first DC voltage is applied, and the level shifter circuit being configured to generate a second DC voltage corresponding to the first DC voltage; and
a voltage variable attenuator configured to output the second input power corresponding to a magnitude of the second DC voltage, to the peaking amplifier, the voltage variable attenuator being configured to increase an attenuation amount of the second input power to be output, upon detecting that the second DC voltage is equal to or exceeds a second predetermined value.

2. The Doherty amplifier according to claim 1, wherein the voltage generator circuit includes:
an input terminal to which the first power is applied;
a first voltage line;
a reference voltage line;
a first capacitive element with a first end electrically connected to the input terminal and a second end electrically connected to the gate of the first transistor, the first transistor including a drain;
a first resistive element and a second resistive element electrically connected in series between the first voltage line and the reference voltage line, a node between the first resistive element and the second resistive element being electrically connected to the gate of the first transistor;
a third resistive element electrically connected between the first voltage line and the drain of the first transistor; and
a second capacitive element electrically connected between the drain of the first transistor and the reference voltage line,
wherein the drain of the first transistor is electrically connected to the gate of the second transistor included in the level shifter circuit.

3. The Doherty amplifier according to claim 2, wherein the second transistor includes a source and a drain electrically connected to the first voltage line,
wherein the level shifter circuit includes a fourth resistive element electrically connected between the source of the second transistor and the reference voltage line, and
wherein the level shifter circuit is configured to output the second DC voltage via the source of the second transistor.

4. The Doherty amplifier according to claim 2, wherein the voltage generator circuit includes a fifth resistive element electrically connected between the drain of the first transistor and the gate of the second transistor.

5. The Doherty amplifier according to claim 2, wherein the voltage variable attenuator includes:
an input terminal to which the second power output from the directional coupler is applied;
an output terminal for providing the attenuated second input power;
a third capacitive element electrically connected in series between the input terminal and the output terminal;
a plurality of transmission lines;
a fourth capacitive element; and
a third transistor with a drain electrically connected between given two transmission lines among the plurality of transmission lines, a gate to which the second DC voltage is applied, and a source electrically connected to the reference voltage line.

* * * * *